(12) United States Patent
Smith

(10) Patent No.: US 6,368,755 B1
(45) Date of Patent: Apr. 9, 2002

(54) MASKS FOR USE IN OPTICAL LITHOGRAPHY BELOW 180 NM

(75) Inventor: Bruce W. Smith, Webster, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 09/498,775

(22) Filed: Feb. 4, 2000

Related U.S. Application Data
(60) Provisional application No. 60/118,795, filed on Feb. 5, 1999.

(51) Int. Cl.$^7$ .................................................. G03F 9/00
(52) U.S. Cl. ............................................................ 430/5
(58) Field of Search ........................... 430/5, 322, 323; 378/34, 35; 250/492.2

(56) References Cited

U.S. PATENT DOCUMENTS

| | | | |
|---|---|---|---|
| 4,722,878 A | * 2/1988 | Watakabe et al. ............. 430/5 |
| 5,679,484 A | 10/1997 | Ito et al. ......................... 430/5 |
| 5,962,174 A | 10/1999 | Pierrat ............................. 430/5 |
| 5,963,841 A | 10/1999 | Karlsson et al. ............. 438/952 |
| 6,027,815 A | 2/2000 | Hsu ............................. 428/426 |
| 6,040,892 A | 3/2000 | Pierrat .......................... 355/53 |

* cited by examiner

Primary Examiner—S. Rosasco
(74) Attorney, Agent, or Firm—Nixon Peabody LLP

(57) ABSTRACT

A mask for use on a layer of imaging material which is located on at least a portion of one surface of a substrate in a lithography process in accordance with one embodiment of the present invention includes a layer of a masking material which has an optical density of at least 4.0 for wavelengths at or below about 180 nm and a thickness of less than about 1000 angstroms. Materials, such as tungsten and amorphous silicon, can be used for the mask.

22 Claims, 2 Drawing Sheets

Reflectivity of an AR coated W film as a function of
AR extinction coefficient and thickness (n=2.7)

MASKS FOR USE IN OPTICAL LITHOGRAPHY BELOW 180 NM

This application claims the benefit of U.S. Provisional Patent Application Ser. No. 60/118,795 filed on Feb. 5, 1999 which is herein incorporated by reference.

FIELD OF THE INVENTION

This invention relates generally to lithography and, more particularly, to masks for use in optical lithography at or below about 180 nm.

BACKGROUND OF THE INVENTION

Lithography is a process for producing a pattern on a semiconductor wafer. The pattern is produced by first exposing a pattern etched into a mask onto a semiconductor wafer coated with a resist material. The projected image of the pattern changes the composition of the resist material on the semiconductor wafer which is then removed to leave a matching pattern on the semiconductor wafer for further processing.

Depending upon the particular lithography application, the mask needs to satisfy several different requirements. The challenge is in finding a material or materials for use as the mask which will satisfy these requirements.

Historically, optical masking has been performed using a layer of chromium rich chromium nitride over fused silica, overcoated with a chromium oxinitride anti-reflective ("AR") layer to reduce reflectivity below 10%. Chromium ("Cr") is an excellent choice from optical and thermomechanical standpoints at wavelengths where it is sufficiently opaque, i.e. wavelengths generally above 180 nm. The spectra of chromium metal shown in FIG. 1 illustrates why it has been such a good mask from about 193 nm to about 436 nm. Referring to FIG. 2, the optical density (plotted here at log (transmission)) of a 1000 Å Cr metal film is shown. Again for wavelengths between about 193 nm and 500 nm, chromium is an excellent choice. The optical density of Cr film is near 5.0 in the ultraviolet ("UV") range and it decreases to ~4.5 at 193 nm. As thinner Cr metal films are used in manufacturing (800 Å for instance), the optical density above 190 nm may still be sufficiently high (above 4.0).

However, as shown in FIG. 1, chromium metal is a less desirable choice as a mask for wavelengths below 193 nm. Additionally, as shown in FIG. 2, at 157 nm, the optical density of the Cr metal film is 3.5 for a 1000 Å film and as low as 3.0 for a 800 Å film. At these optical densities, mask modulation is likely too be low for imaging of fine feature geometry. Unfortunately, a masking film thickness of over about 800 Å is undesirable for 157 nm applications because of the aspect ratio requirements of features smaller than 300 nm. Accordingly, it appears that chromium mask materials may not be adequate below 193 nm, in particular at potential vacuum ultraviolet ("VUV") wavelengths, i.e. from about 120 nm to 180 nm, such as 157 nm.

Another factor in selecting a mask for use in optical lithography below 180 nm is the etch characteristics of the mask. The mask must have suitable etch characteristics with selectivity to the underlying substrate and to the resist material. In other words, the film on the substrate which forms the mask must be made of a material or materials which can be etched to form the pattern to be replicated on semiconductor wafers without significant loss to the underlying substrate or to the resist material.

As yet, an appropriate replacement material or materials for chromium films for use as the mask for lithography at or below 180 nm, i.e. a mask with the desired optical properties and etch characteristics, has not been found.

SUMMARY OF THE INVENTION

A mask for use on a layer of imaging material which is located on at least a portion of one surface of a substrate in a lithography process in accordance with one embodiment of the present invention includes a layer of a masking material which has an optical density of at least 4.0 for wavelengths at or below about 180 nm and a thickness equal to or less than about 1000 angstroms. Materials, such as tungsten and amorphous silicon, can be used for the mask.

A lithography system in accordance with another embodiment of the present invention includes a substrate with at least one surface, a layer of imaging material on at least a portion of the one surface, and a layer of masking material which has an optical density of at least 4.0 for wavelengths at or below about 180 nm and a thickness equal to or less than about 1000 angstroms on at least a portion of the layer of imaging material.

A method for lithography in accordance with another embodiment of the present invention includes a few steps. First, a mask is applied over at least a portion of one surface of a substrate, wherein the mask has an optical density of at least 4.0 for wavelengths at or below about 180 nm and a thickness equal to or less than about 1000 angstroms. Next, a layer of imaging material is applied over at least a portion of the mask. Next, at least a portion of the layer of imaging material and the mask are etched and then the remaining portion of the layer of imaging material is removed. The mask is then exposed to radiation at wavelengths at or below about 180 nm.

The present invention provides a number of advantages including providing a mask which has desirable optical properties for use in optical lithography at or below about 180 nm. More specifically, the mask has an optical density of at least 4.0 for wavelengths at or below about 180 nm with a thickness equal to or less than about 1000 angstroms.

The present invention also provides a mask with suitable etch characteristics. The layer of masking material can be etched without a significant loss of the underlying substrate or resist material.

DETAILED DESCRIPTION

Figure 10:
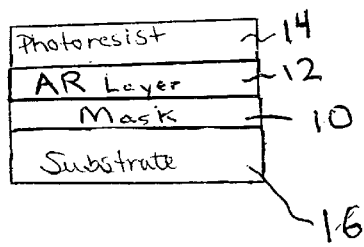
FIG. 10 is a cross-sectional view of a substrate with a layer of photoresist and a mask in accordance with one embodiment of the invention.

A mask film 10 for use in optical lithography at or below about 180 nm in accordance with one embodiment of the invention is illustrated in FIG. 10. The mask 10 has an optical density of at least about 4.0 for wavelengths at or below about 180 nm and a thickness of about 1000 angstroms or less. The present invention provides a number of advantages including providing a mask 10 which has suitable optical properties for lithography at or below about 180 nm and has suitable etch characteristics.

Figure 1:
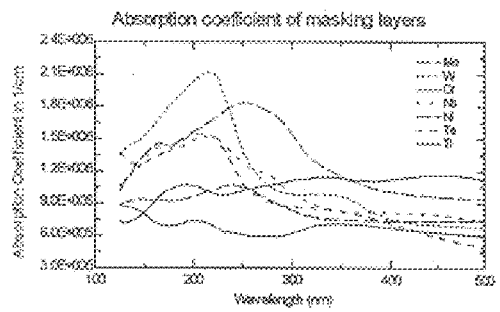
FIG. 1 is a graph illustrating the absorption coefficient (1/cm) for various metals at wavelengths from 110 nm to 500 nm.
Figure 2:
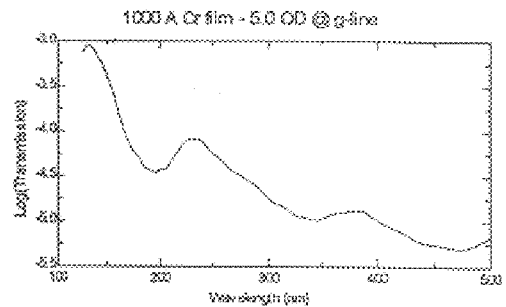
FIG. 2 is a graph illustrating the optical density of a 1000 Å Cr metal film at wavelengths from 110 nm to 500 nm.

Referring to FIG. 1, the absorption coefficients (1/cm) for molybdenum (Mo), tungsten (W), chromium (Cr), niobium (Nb), nickel (Ni), tantalum (Ta), and titanium (Ti) metals at wavelengths from 110 nm to 500 nm are illustrated. As discussed in greater detail earlier in the background with reference to FIGS. 1 and 2, chromium is a good choice for use as a mask 10 for wavelengths ranging between about 193 nm to about 436 nm, but does not possess desirable optical properties as a mask 10 for wavelengths below about 193 nm.

Preferably, a material or materials for use as a mask 10 in optical lithography for wavelengths at or below 180 nm will have an optical density of at least 4.0 for wavelengths at or below 180 nm, conduct sufficient to prevent charging, have dry etch stability, have radiation stability, have good adhesion properties, and have chemical durability. Additionally, the material or materials used for the mask 10 preferably have a thickness equal to or less than about 1000 angstroms, although the thickness can vary as needed or desired.

Figure 3:
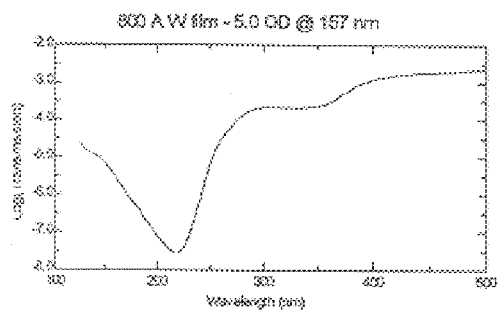
FIG. 3 is a graph illustrating the optical density of a 800 Å W film at wavelengths from 110 nm to 500 nm.
Figure 4:
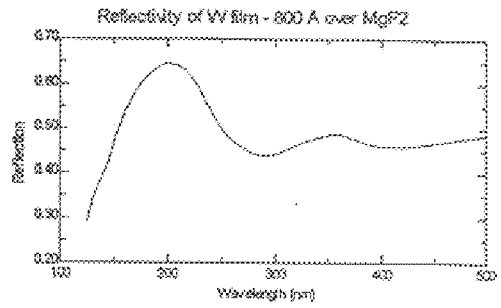
FIG. 4 is a graph illustrating the reflectivity of a 800 Å W film at wavelengths from 110 nm to 500 nm.

One example of a material which meets these requirements and is suitable for use as a mask 10 for optical lithography at or below about 180 nm is tungsten. As shown in FIG. 1, at about 157 nm tungsten has an absorption coefficient six times that of chromium. Additionally, as shown in FIG. 3, an 800 Å thick film of tungsten produces an optical density of 5.0 at about 157 nm which is close to the value for the optical density of chromium at ultraviolet ("UV") wavelengths, i.e. wavelengths between about 250 nm and 450 nm, where chromium is a desired material for a mask 10. Further as shown in FIG. 4, the reflectivity of tungsten at 157 mn is near 50%, which can be reduced through use of an anti-reflective layer ("AR") 12. Preferably, a mask 10 made of tungsten has a thickness between about 400 Å and 1000 Å, although the thickness can vary as needed or desired.

Figure 7:
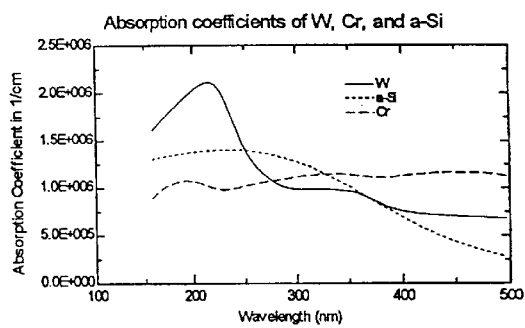
FIG. 7 is a graph illustrating the absorption coefficient (1/cm) for tungsten, amorphous silicon, and chromium at wavelengths from about 150 nm to 500 nm.
Figure 8:
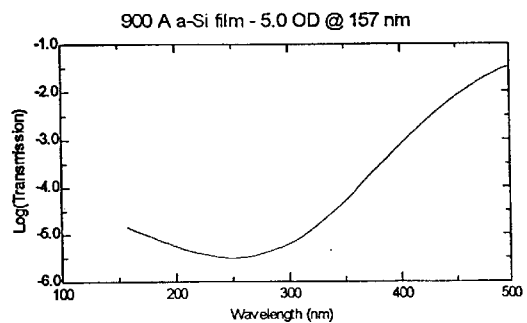
FIG. 8 is a graph illustrating the optical density of a 900 Å a-Si film at wavelengths from about 150 nm to 500 nm.

Another example of a material which is suitable for use as a mask 10 for optical lithography at or below about 180 nm is amorphous silicon. As shown in FIG. 7, at about 157 nm amorphous silicon has an absorption coefficient which is 1.5 times that of chromium. Although amorphous silicon is not as good a material for a mask 10 as tungsten, it still is acceptable. As shown in FIG. 8 a film of amorphous silicon having a thickness of about 900 Å has an optical density near 5.0 at about 157 nm. Preferably, a mask made of amorphous silicon has a thickness between about 400 Å and 1000 Å, although the thickness can vary as needed or desired. Although tungsten and amorphous silicon are disclosed as materials which can be used for the mask 10 for optical lithography at or below about 180 nm, other materials which have an optical density of at least 4.0 for wavelengths at or below about 180 nm and a thickness equal to or less than about 1000 angstroms may also be used.

Figure 5:
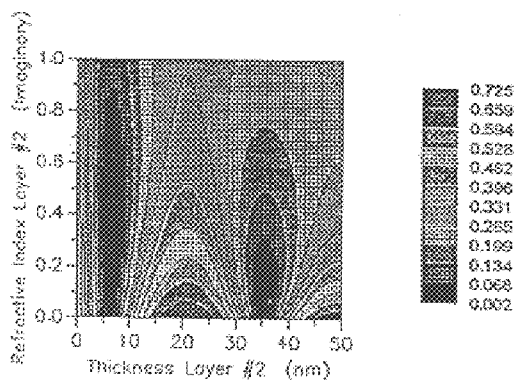
FIG. 5 is a graph illustrating the reflectivity of an AR coated W film as a function of AR extinction coefficient and thickness.
Figure 6:
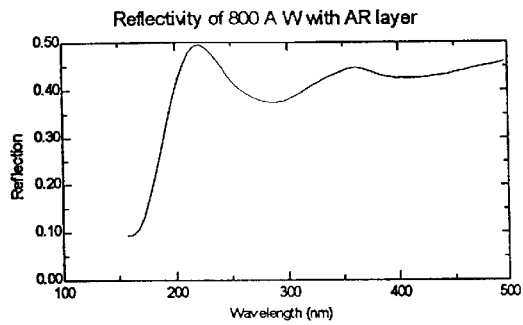
FIG. 6 is a graph illustrating the reflectivity of a 800 Å W film with an AR layer at wavelengths from about 150 nm to 500 nm.
Figure 9:
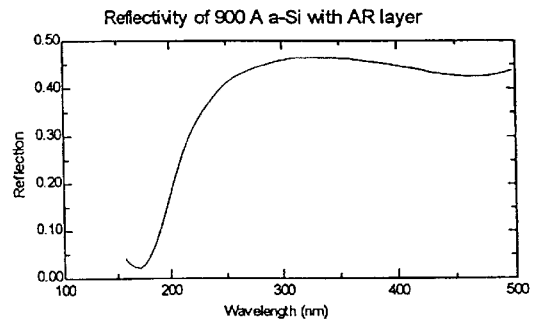
FIG. 9 is a graph illustrating the reflectivity of a 900 Å a-Si film with an AR layer at wavelengths from about 150 nm to 500 nm.

Preferably, the mask 10 has a reflectivity of less than about 20%, however even if the reflectivity is higher than desired the reflectivity can be reduced. To reduce reflectivity of the mask 10, an optional an AR layer 12, such as a metal nitride, oxide, or fluoride, may be added over at least a portion of the mask 10. Referring to FIG. 5, a plot of the reflectivity tungsten as a function of a tungsten nitride, tungsten oxide, or tungsten exintride AR layer 12 extinction coefficient and thickness for a fixed refractive index (real) of 2.7 is shown. As shown in this graph, several possibilities exist that produce a reflectivity below about 10%. Referring to FIG. 6, the reflectivity of a film of tungsten with an AR layer 12 of 60 Å is illustrated. As shown in this graph, the reflectivity of the tungsten with the AR layer 12 of 60 Å at about 157 nm is below 10%. Referring to FIG. 9, the reflectivity of a film of the layer of amorphous silicon with a silicon oxinitride AR layer 12 of 80 Å is illustrated. As shown in this graph, the reflectivity of the layer of amorphous silicon with the AR layer 12 of 80 Å at about 157 nm is also below 10%. Although tungsten oxinitride and silicon oxinitride are shown as possible AR layers, other materials, such as other group IV, V, and VI metal nitrides, oxides, and oxinitrides can also be used as AR layers.

Preferably, the material or materials used for the mask 10 in optical lithography for wavelengths at or below 180 nm will have suitable etch characteristics. Both tungsten and amorphous silicon can be easily etched using one of a variety of different etching techniques, such as the use of halogen chemistry, which is well known to those or ordinary skill in the art. Etch rates for both tungsten and amorphous silicon, as well as for any optional AR layers 12, are higher than that demonstrated for chromium.

A lithographic process using a mask 10 in accordance with one embodiment of the present invention will be discussed with reference to FIG. 10.

First a mask layer 10 is placed over at least a portion of one surface of substrate 16. Preferably, the mask 10 has an optical density of at least 4.0 for wavelengths at or below about 180 nm and a thickness equal to or less than about 1000 angstroms. By way of example only, the mask 10 may comprise a layer of material, such as tungsten or amorphous silicon.

Next, an optional AR layer 12 may be added over the mask 10. The AR layer 12 is added to reduce the reflectivity to be preferably below about 20%, although the desired percentage of reflectivity can vary as needed or desired . By way of example only, the AR layer 12 may comprise a layer of material, such as tungsten oxinitride or silicon oxinitride.

Next, a layer of imaging material 14, such as a photoresist, is applied over the mask 10 and the optional AR layer 12. Once the imaging material is in place, the imaging material is exposed and developed using electronic beam or radiation exposure. Next, the mask 10 and the optional AR layer 12 are etched to form the desired pattern. A variety of different techniques can be used to etch the mask 10 and the AR layer 12, such as using halogen chemistries, which are well known to those of ordinary skill in the art and thus will not be described here.

Once the mask 10 the AR layer 12 have been etched into the desired pattern, the imaging material 14 is removed.

Having thus described the basic concept of the invention, it will be rather apparent to those skilled in the art that the foregoing detailed disclosure is intended to be presented by way of example only, and is not limiting. Various alternations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. A mask for use on a layer of imaging material which is located on at least a portion of one surface of a substrate in a lithography process, the mask comprising a layer of a masking material which has an optical density of at least 4.0 for wavelengths at or below about 180 nm and a thickness equal to or less than about 1000 angstroms.

2. The mask as set forth in claim 1 wherein the layer of masking material comprises tungsten.

3. The mask as set forth in claim 2 wherein the tungsten has a thickness between about 400 angstroms and 1000 angstroms.

4. The mask as set forth in claim 1 wherein the layer of masking material comprises amorphous silicon.

5. The mask as set forth in claim 4 wherein the amorphous silicon has a thickness between about 400 angstroms and 1000 angstroms.

6. The mask as set forth in claim 1 further comprising an anti-reflective layer over at least a portion of the mask.

7. The mask as set forth in claim 6 wherein the anti-reflective layer comprises a nitride, oxide, fluoride, or oxinitride of Ti, V, Cr, Zr, Nb, Mo, Ht, Ta, W, Cu, Ni, or Fe.

8. A lithography system comprising:

a substrate with at least one surface;

a layer of imaging material on at least a portion of the one surface; and a layer of masking material which has an optical density of at least 4.0 for wavelengths at or below about 180 nm and a thickness equal to or less than about 1000 angstroms on at least a portion of the layer of imaging material.

9. The system as set forth in claim 8 wherein the layer of masking material comprises tungsten.

10. The system as set forth in claim 9 wherein the tungsten has a thickness between about 400 angstroms and 1000 angstroms.

11. The system as set forth in claim 8 wherein the layer of masking material comprises amorphous silicon.

12. The system as set forth in claim 11 wherein the amorphous silicon has a thickness between about 400 angstroms and 1000 angstroms.

13. The system as set forth in claim 8 wherein the layer of imaging material comprises photoresist.

14. The system as set forth in claim 8 further comprising an anti-reflective layer over at least a portion of the mask.

15. The system as set forth in claim 14 wherein the anti-reflective layer comprises a nitride, oxide, fluoride, or oxinitride of Ti, V, Cr, Zr, Nb, Mo, Ht, Ta, W, Cu, Ni, or Fe.

16. A method for lithography comprising:

placing a mask over at least a portion of one surface of a substrate, wherein the mask has an optical density of at least 4.0 for wavelengths at or below about 180 nm and a thickness of less than about 1000 angstroms;

applying a layer of imaging material over at least a portion of the mask;

etching at least a portion of the layer of imaging material and the mask;

removing the remaining portion of the layer of imaging material; and exposing the mask to radiation at wavelengths at or below about 180 nm.

17. The method as set forth in claim 16 wherein the mask comprises tungsten.

18. The method as set forth in claim 17 wherein the tungsten has a thickness between about 400 angstroms and 1000 angstroms.

19. The method as set forth in claim 16 wherein the mask comprises amorphous silicon.

20. The method as set forth in claim 19 wherein the amorphous silicon has a thickness between about 400 angstroms and 1000 angstroms.

21. The method as set forth in claim 16 further comprising applying an anti-reflective layer over at least a portion of the mask.

22. The method as set forth in claim 16 wherein the anti-reflective layer comprises a nitride, oxide, fluoride, or oxinitride of Ti, V, Cr, Zr, Nb, Mo, Ht, Ta, W, Cu, Ni, or Fe.

* * * * *